United States Patent
Jang et al.

(10) Patent No.: US 12,097,841 B2
(45) Date of Patent: Sep. 24, 2024

(54) VEHICLE AND METHOD OF CONTROLLING THE SAME

(71) Applicants: Hyundai Motor Company, Seoul (KR); Kia Motors Corporation, Seoul (KR)

(72) Inventors: Jiwoong Jang, Gyeonggi-do (KR); Sangcheol Shin, Gyeonggi-do (KR); Youngseul Lim, Seoul (KR); YooJong Lee, Gyeonggi-do (KR); Ki Jong Lee, Gyeonggi-do (KR); Kangho Jeong, Gyeonggi-do (KR)

(73) Assignees: Hyundai Motor Company, Seoul (KR); Kia Motors Corporation, Seoul (KR)

(*) Notice: Subject to any disclaimer, the term of this patent is extended or adjusted under 35 U.S.C. 154(b) by 953 days.

(21) Appl. No.: 17/122,632

(22) Filed: Dec. 15, 2020

(65) Prior Publication Data
US 2022/0073051 A1   Mar. 10, 2022

(30) Foreign Application Priority Data

Sep. 7, 2020   (KR) .................. 10-2020-0113674

(51) Int. Cl.
*G05F 1/10* (2006.01)
*B60W 20/15* (2016.01)
*B60W 20/20* (2016.01)
*B60W 20/40* (2016.01)
*G06F 1/10* (2006.01)

(52) U.S. Cl.
CPC ............ *B60W 20/20* (2013.01); *B60W 20/15* (2016.01); *B60W 20/40* (2013.01); *G06F 1/10* (2013.01)

(58) Field of Classification Search
CPC ...... B60W 20/20; B60W 20/15; B60W 20/40; G06F 1/10; B60L 2240/525; B60L 3/003; B60L 15/08; B60L 15/20; B60L 50/60; B60L 15/007; B60L 53/20; B60L 2240/429; Y02T 10/64; Y02T 10/70; Y02T 10/7072; Y02T 10/72; Y02T 90/14; Y02T 10/62; Y02T 90/40; H02M 1/0006; H02M 7/53871; H02M 1/08; H02M 1/327; H02M 7/04; H02P 29/68; H02P 27/085; H02P 27/08; H02P 27/04; H03K 17/14; B60Y 2200/91; B60Y 2200/92; B60Y 2400/302
See application file for complete search history.

(56) References Cited

U.S. PATENT DOCUMENTS

| | | | | |
|---|---|---|---|---|
| 9,966,877 | B2* | 5/2018 | Yamamoto | ............. H03K 17/04 |
| 10,967,954 | B2* | 4/2021 | Nakagawa | ............. B64C 13/50 |
| 2005/0099142 | A1* | 5/2005 | Cottongim | ......... H05B 41/3925 |
| | | | | 315/309 |

(Continued)

*Primary Examiner* — Masud Ahmed
(74) *Attorney, Agent, or Firm* — Fox Rothschild LLP

(57) ABSTRACT

A vehicle for supplying a constant current to a motor without changing a gate voltage even at high temperatures is provided. The vehicle includes at least one switching element that supplies a current to a motor; a temperature sensor that detects temperature information of at least one transistor; at least one processor that transmits a clock signal corresponding to driving of the motor; and a driver that receives the clock signal, and transmits a driving signal to the transistor. A converter then determines a duty of the driving signal based on the temperature information received from the temperature sensor.

12 Claims, 7 Drawing Sheets

(56) References Cited

U.S. PATENT DOCUMENTS

| | | | | |
|---|---|---|---|---|
| 2015/0277456 | A1* | 10/2015 | Illing | G05F 1/10 |
| | | | | 323/265 |
| 2016/0072423 | A1* | 3/2016 | Kanazawa | H02K 11/33 |
| | | | | 318/400.26 |
| 2017/0302262 | A1* | 10/2017 | Hirata | H01L 29/7393 |
| 2022/0321029 | A1* | 10/2022 | Yano | H02M 1/08 |

* cited by examiner

VEHICLE AND METHOD OF CONTROLLING THE SAME

CROSS-REFERENCE TO RELATED APPLICATION(S)

This application is based on and claims priority under 35 U.S.C. § 119 to Korean Patent Application No. 10-2020-0113674, filed on Sep. 7, 2020, the disclosure of which is incorporated by reference in its entirety.

TECHNICAL FIELD

The disclosure relates to a vehicle for efficiently controlling a motor of an eco-friendly vehicle, and a method of controlling the vehicle.

BACKGROUND

An eco-friendly vehicle is a next-generation vehicle that minimizes pollution by using hydrogen or electricity as power sources. Currently, power elements used in power modules for inverters occupy a large part of the power module material cost. Therefore, a research is being conducted to increase the cost competitiveness by improving a current density of the power element and improving a cooling performance of the power module to minimize a chip size of the power element.

However, even if the cooling performance is improved, the current density acts as an obstacle for reducing the chip size. In other words, a saturation current of the power element must be greater than a maximum output current required by a system. In a saturation region of the power element, not only does not produce a current greater than or equal to the saturation current, but also because a voltage (Vce) across the element increases, a power consumption increases and substantial heat is generated, which may destroy the element. Therefore, a research to solve these problems is being actively conducted.

SUMMARY

An aspect of the disclosure provides a vehicle that supplies a constant current to a motor without changing a gate voltage even at high temperatures, and a method of controlling the vehicle. Additional aspects of the disclosure will be set forth in part in the description which follows and, in part, will be obvious from the description, or may be learned by practice of the disclosure.

In accordance with an aspect of the disclosure, a vehicle may include at least one switching element configured to supply a current to a motor; a temperature sensor configured to obtain temperature information of at least one transistor; at least one processor configured to transmit a clock signal that corresponds to driving of the motor; and a driver configured to receive the clock signal, and to transmit a driving signal to the transistor. A converter may be configured to determine a duty of the driving signal based on the temperature information received from the temperature sensor.

The clock signal may include a triangular wave signal. The driving signal may include a pulse width modulation (PWM) signal. The converter may be configured to convert the triangular wave signal into the PWM signal. The processor may be configured to correct a sensing voltage of the temperature sensor based on an increase in a temperature of the transistor. The converter may be configured to increase the duty of the driving signal in response to the corrected sensing voltage.

The processor may be configured to correct a sensing voltage of the temperature sensor based on a decrease in a temperature of the transistor. The converter may be configured to decrease the duty of the driving signal in response to the corrected sensing voltage. The converter may be configured to determine the duty based on an intersection of the sensing voltage and the clock signal. The at least switching element may be provided with at least one transistor element. A saturation current of the at least one transistor element may be configured to be determined independently from the temperature information. The vehicle may be provided as one of a hybrid electric vehicle (HEV), a battery electric vehicle (BEV), a plug-in hybrid electric vehicle (PHEV), and a fuel cell electric vehicle (FCEV).

In accordance with another aspect of the disclosure, a method of controlling a vehicle may include obtaining, by a temperature sensor, temperature information of at least one transistor; transmitting, by at least one processor, a clock signal that corresponds to driving of a motor; receiving, by a driver, the clock signal, and transmitting a driving signal to the transistor, and determining, by a converter, a duty of the driving signal based on the temperature information received from the temperature sensor.

The clock signal may include a triangular wave signal. The driving signal may include a pulse width modulation (PWM) signal. The method may further include converting, by the converter, the triangular wave signal into the PWM signal. The determining of the duty of the driving signal may include correcting a sensing voltage based on an increase in a temperature of the transistor; and increasing the duty of the driving signal in response to the corrected sensing voltage.

The determining of the duty of the driving signal may include correcting a sensing voltage based on a decrease in a temperature of the transistor; and decreasing the duty of the driving signal in response to the corrected sensing voltage. The determining of the duty of the driving signal may include determining the duty based on an intersection of the sensing voltage and the clock signal.

The at least switching element may be provided with at least one transistor element. A saturation current of the at least one transistor element may be configured to be determined independently from the temperature information. The vehicle may be provided as one of a hybrid electric vehicle (HEV), a battery electric vehicle (BEV), a plug-in hybrid electric vehicle (PHEV), and a fuel cell electric vehicle (FCEV).

BRIEF DESCRIPTION OF THE DRAWINGS

These and/or other aspects of the disclosure will become apparent and more readily appreciated from the following description of the exemplary embodiments, taken in conjunction with the accompanying drawings of which.

DETAILED DESCRIPTION

Figure 1:
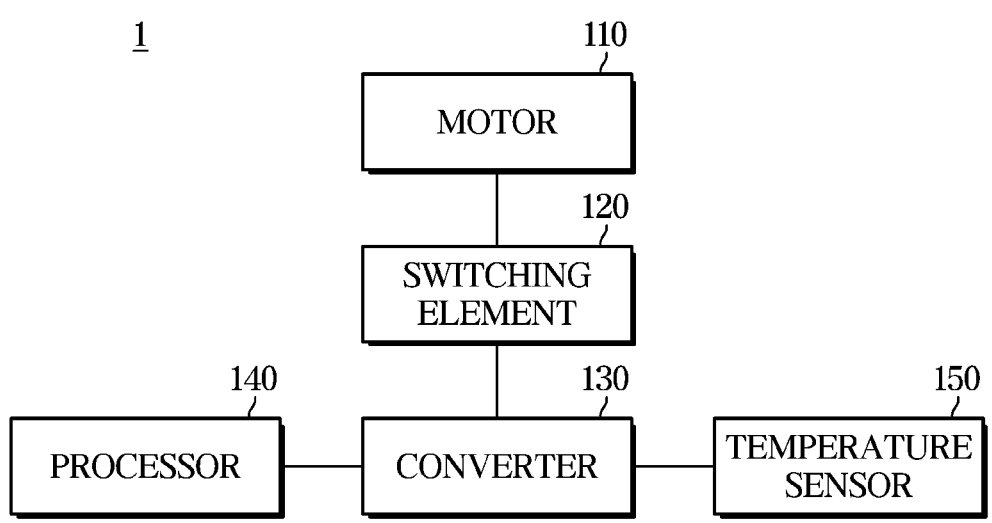
FIG. 1 is a control block diagram of a vehicle according to an exemplary embodiment of the disclosure.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

Although exemplary embodiment is described as using a plurality of units to perform the exemplary process, it is understood that the exemplary processes may also be performed by one or plurality of modules. Additionally, it is understood that the term controller/control unit refers to a hardware device that includes a memory and a processor and is specifically programmed to execute the processes described herein. The memory is configured to store the modules and the processor is specifically configured to execute said modules to perform one or more processes which are described further below.

Furthermore, control logic of the present disclosure may be embodied as non-transitory computer readable media on a computer readable medium containing executable program instructions executed by a processor, controller/control unit or the like. Examples of the computer readable mediums include, but are not limited to, ROM, RAM, compact disc (CD)-ROMs, magnetic tapes, floppy disks, flash drives, smart cards and optical data storage devices. The computer readable recording medium can also be distributed in network coupled computer systems so that the computer readable media is stored and executed in a distributed fashion, e.g., by a telematics server or a Controller Area Network (CAN).

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

Like reference numerals refer to like elements throughout the specification. Not all elements of the embodiments of the disclosure will be described, and the description of what are commonly known in the art or what overlap each other in the exemplary embodiments will be omitted. The terms as used throughout the specification, such as "~part," "~module," "~member," "~block," etc., may be implemented in software and/or hardware, and a plurality of "~parts," "~modules," "~members," or "~blocks" may be implemented in a single element, or a single "~part," "~module," "~member," or "~block" may include a plurality of elements.

It will be further understood that the term "connect" and its derivatives refer both to direct and indirect connection, and the indirect connection includes a connection over a wireless communication network. It will be further understood that the term "member" and its derivatives refer both to when a member is in contact with another member and when another member exists between the two members.

Further, when it is stated that a layer is "on" another layer or substrate, the layer may be directly on another layer or substrate or a third layer may be disposed therebetween. It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section.

It is to be understood that the singular forms "a," "an," and "the" include plural references unless the context clearly dictates otherwise. Reference numerals used for method steps are merely used for convenience of explanation, but not to limit an order of the steps. Thus, unless the context clearly dictates otherwise, the written order may be practiced otherwise.

Hereinafter, an operation principle and exemplary embodiments of the disclosure will be described with reference to accompanying drawings. FIG. 1 is a control block diagram of a vehicle according to an exemplary embodiment of the disclosure. A vehicle according to an embodiment may include a switching element 120, a temperature sensor 150, a processor 140, and a converter 130.

The switching element 120 may be configured to supply a current to a motor 110 provided within the vehicle. The switching element 120 may be provided as a transistor element including a use region and a saturation current region. Meanwhile, the switching element 120 provided within the vehicle may have a different saturation current region according to a gate voltage or a temperature. Meanwhile, an output current of the switching element 120 may be determined independently from temperature information of the motor 110 or the like.

The output current may be a current transmitted by the switching element 120 and transmitted to the motor 110 and the like, and may be determined in a different manner from a saturation current determined by the transistor element itself. The temperature sensor 150 may be configured to sense the temperature of the switching element 120 provided within the vehicle. The temperature sensor 150 may include at least one diode temperature sensor 150.

Meanwhile, the vehicle may include at least one processor 140 configured to operate the motor 110. The processor 140 may be configured to generate a clock signal corresponding to driving of the motor 110. The clock signal may refer to a signal for driving the motor 110 based on a command input by a user, and may be provided as an alternating current (AC) signal and a triangular waveform signal as described later. Meanwhile, the vehicle may include a converter 130. The converter 130 may be provided as a fly-back controller. Particularly, the converter 130 may be provided as an alternating current (AC)-direct current (DC) converter 130.

The converter 130 may be configured to receive a clock signal from the processor 140 and transmit a driving signal to the switching element 120. The clock signal may include the triangular wave signal, and the driving signal may include a pulse width modulation (PWM) signal. The converter 130 may be configured to determine a duty of the driving signal based on the temperature information received from the temperature sensor 150. Particularly, in response to determining that the temperature of the switching element 120 is greater than a threshold temperature, the saturation current of the switching element 120 is decreased, and thus, the converter 130 may be configured to increase the duty to maintain an amount of current supplied to the motor 110 as before the temperature increases.

The converter 130 may be configured to change the clock signal made of the triangular wave signal into the driving signal including the PWM signal. A detailed description of an operation of changing the clock signal to the PWM signal will be described later. The temperature sensor 150 may be configured to decrease a sensing voltage based on an increase in a temperature of a transistor. The converter 130 may be configured to increase the duty of the driving signal in response to the decreased sensing voltage. Conversely, the temperature sensor 150 may be configured to increase the sensing voltage based on a decrease in the temperature of the switching element 120. The converter 130 may be configured to reduce the duty of the driving signal in response to the increased sensing voltage.

The sensing voltage is a voltage output from the temperature sensor 150. When the temperature of the switching element 120 is greater than a threshold temperature, the sensing voltage may output low, and when the temperature of the switching element 120 is less than the threshold temperature, the sensing voltage may output high. This operation may be executed by the processor 140 provided in the vehicle. Particularly, the processor 140 provided within the vehicle may be configured to correct the sensing voltage of the temperature sensor 150 based on the increase in the temperature of the transistor. Particularly, as the temperature increases, the sensing voltage may be decreased.

In addition, the processor 140 may be configured to correct the sensing voltage of the temperature sensor 150 based on the decrease in the temperature of the transistor. Particularly, when the temperature decreases, the sensing voltage of the temperature sensor 150 may be increased. The converter 130 may be configured to determine the duty of the driving signal based on an intersection of the sensing voltage and the clock signal. Meanwhile, the above-described configuration may be provided with eco-friendly vehicles such as a hybrid electric vehicle (HEV), a battery electric vehicle (BEV), a plug-in hybrid electric vehicle (PHEV), and a fuel cell electric vehicle (FCEV).

At least one component may be added or deleted corresponding to the performance of the components of the vehicle illustrated in FIG. 1. It will be readily understood by those skilled in the art that the mutual position of the components may be changed corresponding to the performance or structure of the vehicle 1. In the meantime, each of the components illustrated in FIG. 1 may be referred to as a hardware component such as software and/or a field programmable gate array (FPGA) and an application specific integrated circuit (ASIC).

Figure 2:
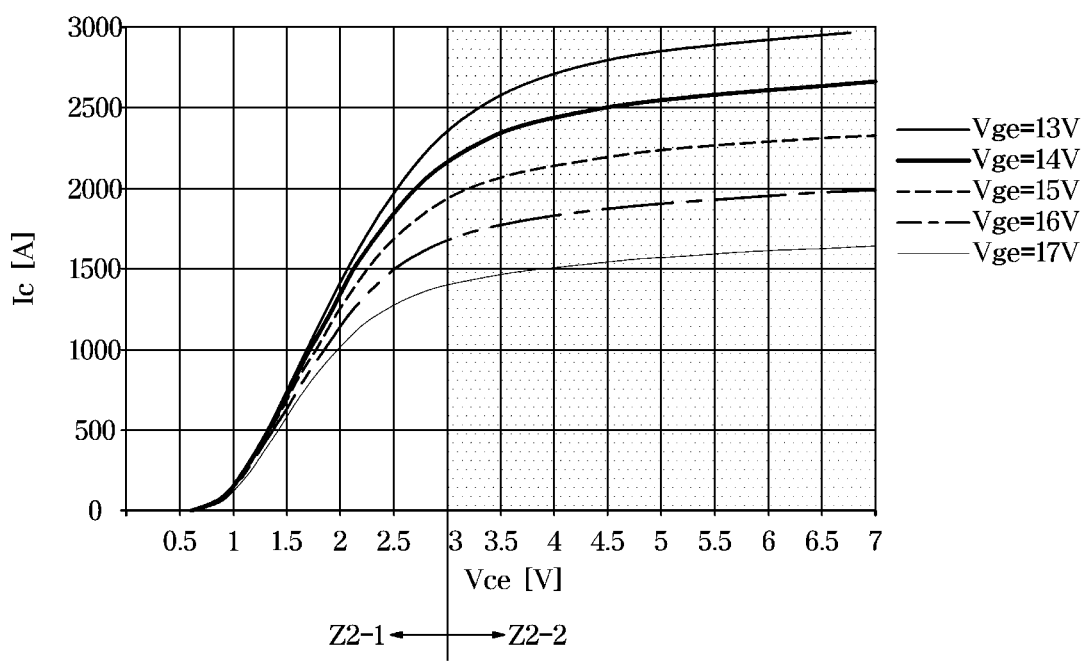
FIGS. 2 and 3 are graphs illustrating current characteristics for each temperature of a switching element according to an exemplary embodiment of the disclosure.
Figure 3:
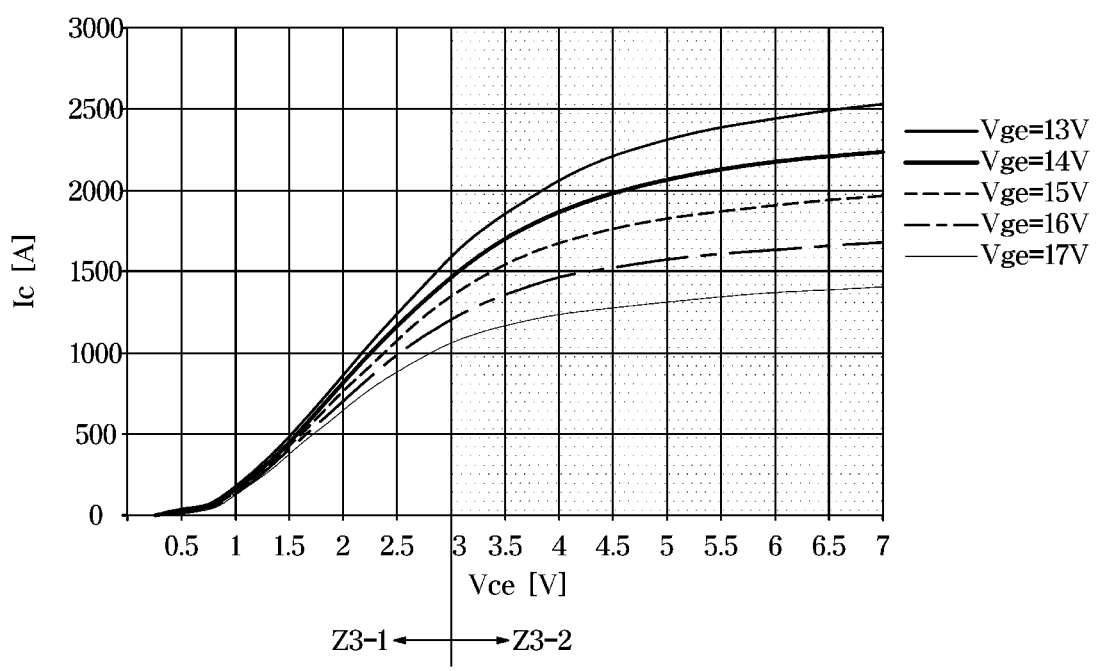

FIGS. 2 and 3 are graphs illustrating current characteristics for each temperature of a switching element according to an exemplary embodiment of the disclosure. FIG. 2 is a view illustrating the operation of the switching element 120 at an ordinary temperature, and FIG. 3 is a view illustrating the operation of the switching element 120 at a high temperature.

Particularly, Z2-1 of FIG. 2 and Z3-1 of FIG. 3 may denote the use region of an IGBT, and regions Z2-2 and Z3-2 denote the saturation current region of the IGBT. Referring to FIGS. 2 and 3, voltage and current characteristics according to the gate voltage of the switching element 120 are illustrated. Particularly, FIG. 2 is a graph illustrating the characteristics of voltage and current at the ordinary temperature (25° C.), and FIG. 3 is a graph illustrating the characteristics of voltage and current at the high temperature (175° C.).

The switching element 120 may be configured to differentially transmit the current according to the gate voltage. The higher the gate voltage, the greater the amount of current may be transmitted to the switching element 120, and the higher the temperature of the switching element 120, the smaller the current may be delivered. According to the exemplary embodiment, a gate driving voltage for driving the switching element 120 may be determined to be 15V.

Referring to FIG. 2, when the gate voltage of the switching element 120 is 15V, the saturation current at the ordinary temperature may be determined to be about 1900 A. Meanwhile, referring to FIG. 3, when a junction temperature increases to the high temperature, the saturation current may be limited to about 1300 A. Therefore, when high temperature use is considered, the current output from the switching element 120 is about 1300 A.

Conventionally, to solve this problem, a method of increasing the gate voltage of the switching element 120 may be considered. Particularly, when the gate voltage applied to the switching element 120 is compensated and used at the high temperature, the saturation current limitation may be relaxed. Particularly, referring to FIG. 3, when the gate voltage is increased from 15V to 17V, the saturation current may be increased to about 1600 A. Meanwhile, in this case, the chip size must be increased. Hereinafter, an operation of the disclosure for solving this problem will be described.

Figure 4:
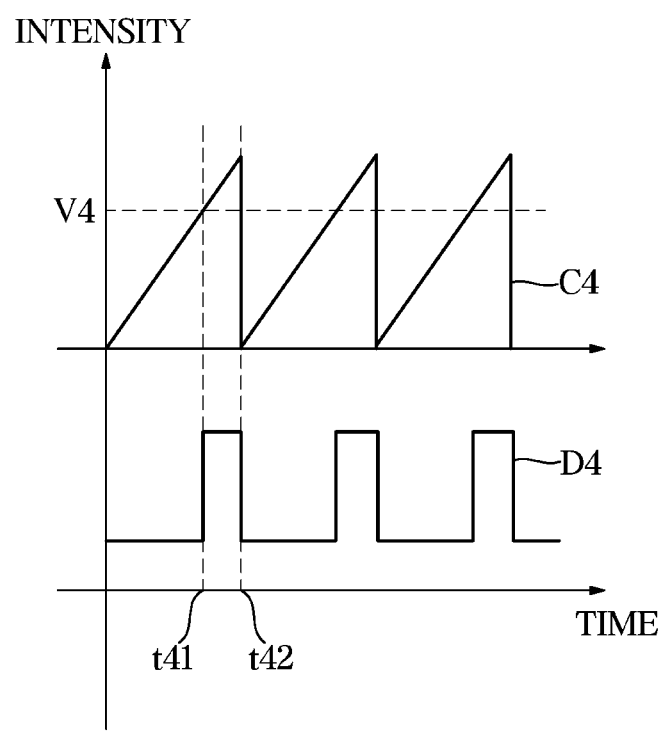
FIGS. 4 and 5 are views for describing a relationship between a clock signal and a pulse width modulation (PWM) signal according to an exemplary embodiment of the disclosure.
Figure 5:
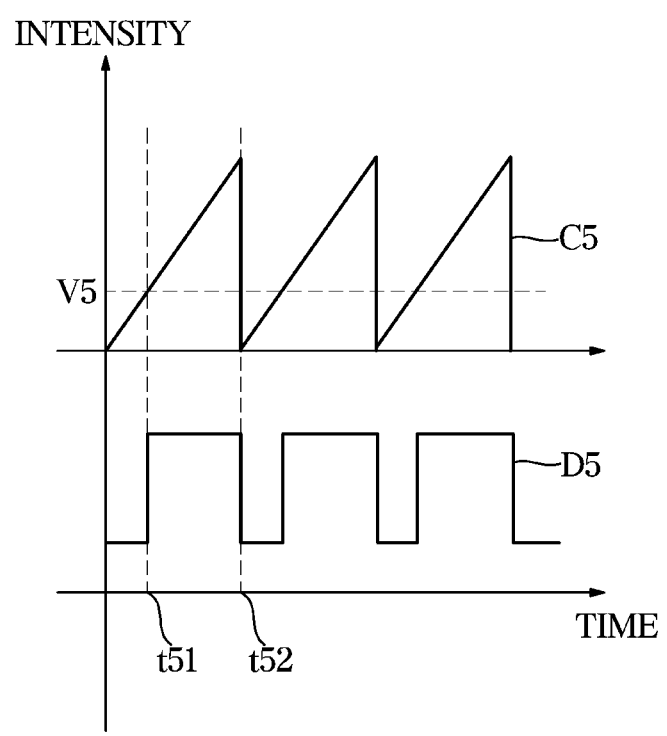

FIGS. 4 and 5 are views for describing a relationship between a clock signal and a pulse width modulation (PWM) signal according to an exemplary embodiment of the disclosure. Referring to FIG. 4, it illustrates the clock signal, the sensing voltage, and the driving signal derived based on the clock signal at the ordinary temperature.

The processor 140 included within the vehicle may be configured to transmit the clock signal to the converter 130 to drive the motor 110. The converter 130 may be configured to obtain the temperature information from the temperature sensor 150 provided in the switching element 120. The temperature information may include the sensing voltage determined based on the temperature of the switching element 120. The sensing voltage may be determined to be low when the temperature of the switching element 120 is high, and may be determined to be high when the temperature of the switching element 120 is low.

FIG. 4 illustrates a case where the switching element 120 is driven at the ordinary temperature. In particular, the sensing voltage V4 received from the temperature sensor 150 may be determined to be relatively high. The converter 130 may be configured to receive a clock signal C4 for driving the motor 110 from the processor 140, and determine a driving signal D4 based on a sensing voltage V4 received from the temperature sensor 150. The driving signal D4 may be determined as the intersections t41 and t42 of the clock signal C4 and the sensing voltage.

In FIG. 4, the driving signal D4 may be determined as the intersection of the clock signal C4 and the sensing voltage V4. In particular, the duty of the driving signal D4 may be determined by the intersection of the sensing voltage V4 and the clock signal C4. At the ordinary temperature, since the saturation current of the switching element 120 is sufficient, the duty of the driving signal does not increase.

FIG. 5 is a graph illustrating the relationship between the current and voltage of the switching element 120 at the high temperature. Referring to FIGS. 5 and 4, FIG. 5 illustrates that the switching element 120 is driven at the high temperature and thus outputs a low saturation current. In particular, the temperature sensor 150 may be configured to transmit the low sensing voltage V5 to the converter 130. The converter 130 may be configured to determine the driving signal D5 by receiving a clock signal C5 for driving the switching element 120 from the processor 140 and a sensing voltage V5 from the temperature sensor 150.

Meanwhile, in FIG. 5, the low sensing voltage V5 may be received. Meanwhile, the converter 130 may be configured to determine the duty of the driving signal D5 based on the intersections t51 and t52 of the clock signal C5 and the sensing voltage V5. In particular, the temperature of the switching element 120 is high and the sensing voltage V5 is low. Since a distance between the sensing voltage V5 and the intersections t51 and t52 of the clock signal C5 is wider than that of FIG. 4, in this case, the driving signal having a large duty may be output.

Meanwhile, since FIG. 5 is the operation of the switching element 120 at the high temperature and the saturation current is low, the converter 130 may be configured to drive the switching element 120 by outputting the driving signal D5 having the high duty. Accordingly, the switching element 120 of FIG. 5 has the lower saturation current than that of FIG. 4 but has the higher duty, to supply the current required for driving the motor 110 to the motor 110. Meanwhile, the operations described with reference to FIGS. 4 and 5 are only an exemplary embodiment of the disclosure, and there is no limitation on the operation of changing the driving signal based on the temperature of the switching element 120.

Figure 6:
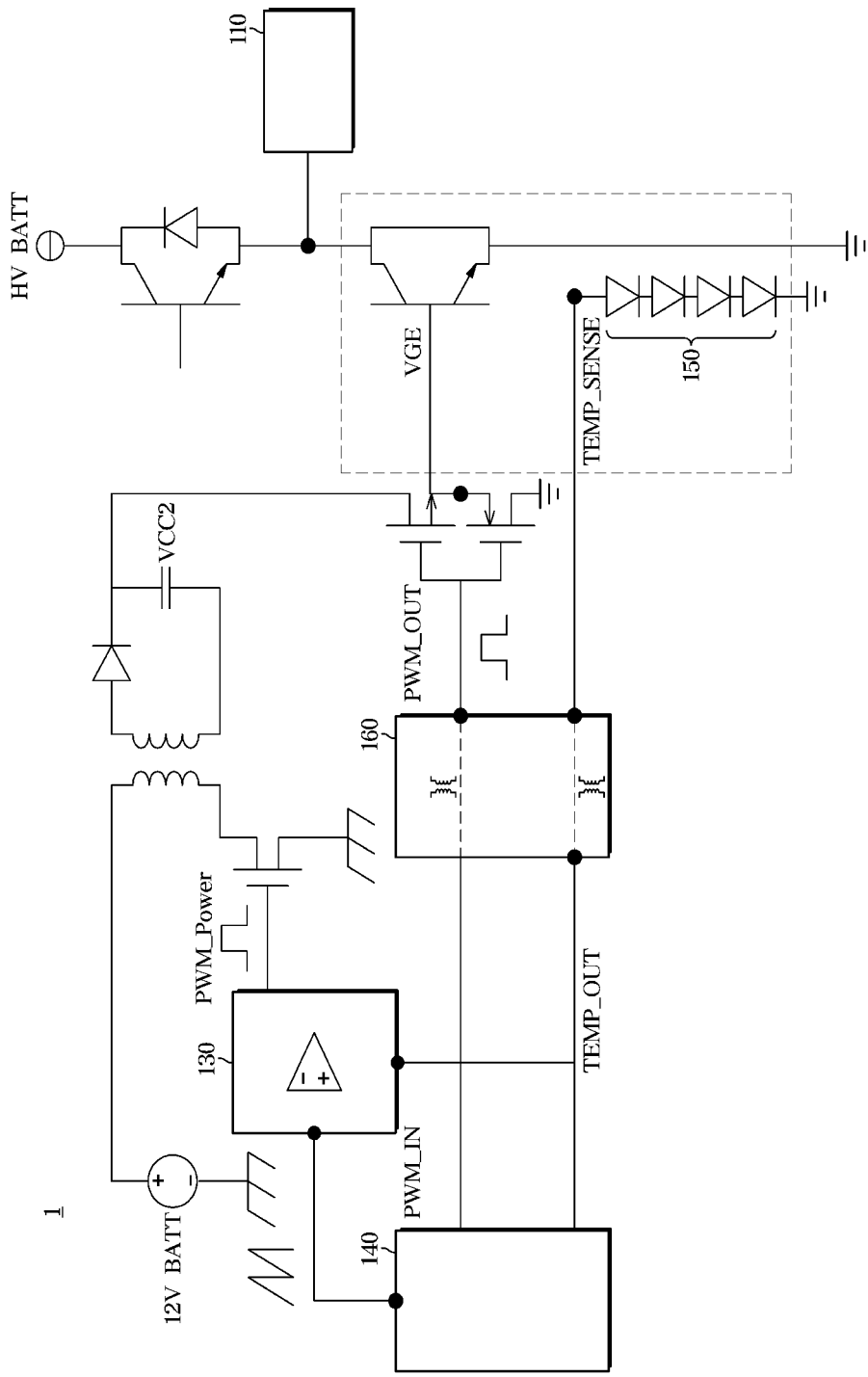
FIG. 6 is a view illustrating a circuit included in a vehicle according to an exemplary embodiment of the disclosure.

FIG. 6 is a view illustrating a circuit included in a vehicle according to an exemplary embodiment of the disclosure. FIG. 6 illustrates the processor 140, the converter 130, a driver IC, the temperature sensor 150, and the switching element 120. According to the exemplary embodiment, the at least one processor 140 may be configured to generate the clock signal for driving the motor 110 based on the user's command. The generated clock signal may be transmitted to the converter 130, and the converter 130 may be configured to generate the driving signal based on the sensing voltage received from the temperature sensor 150. The temperature sensor 150 may be configured to detect junction temperature information of the switching element 120.

As described above, the sensing signal may be transmitted via the temperature sensor 150 of the switching element 120. The converter 130 may be provided as the fly-back controller. The converter 130 may include a transformer be configured to generate the driving signal, and the converter 130 may be configured to adjust power using power of the driver IC and a gate duty (PWM_Power). The converter 130 may be configured to receive temperature information (TEMP_OUT) of the switching element 120 and compare the clock signal of the processor 140 with the sensing voltage using a comparator configured therein, and adjust the current supplied to the motor 110 by adjusting the duty of the driving signal according to the temperature.

For example, when the temperature increases, the sensing voltage decreases. is the controller be configured to increase the duty of the driving signal based on the sensing voltage and the clock signal. Therefore, the converter 130 may be configured to compensate for the decrease in the saturation current due to the high temperature by increasing the saturation current compared to the conventional one.

Meanwhile, the at least one processor 140 may be configured to transmit the driving signal supplied to the converter 130 to the driver IC, and the driver IC may be configured to transmit the driving signal having the determined duty to the switching element 120 as described above. The switching element 120 may be configured to supply the current to the motor 110 independently of temperature. Particularly, since the saturation current of the switching element 120 may be maintained at the ordinary temperature, the sensing voltage transmitted by the temperature sensor 150 is transmitted high, so that the switching element 120 may be driven with a low-duty driving signal.

On the other hand, at high temperatures, since the saturation current of the switching element 120 is maintained low, the sensing voltage transmitted by the temperature sensor 150 is transmitted low, and thus, the switching element 120 may be driven with a high-duty driving signal. When the temperature of the switching element 120 increases, the duty of the driving signal increases even if the saturation current of the switching element 120 is low, and thus, a constant current can be supplied to the motor 110. Meanwhile, the circuit diagram illustrated in FIG. 6 is merely an exemplary embodiment of the disclosure, and there is no limitation on the form of the circuit diagram for controlling the current supply of the motor 110.

Figure 7:
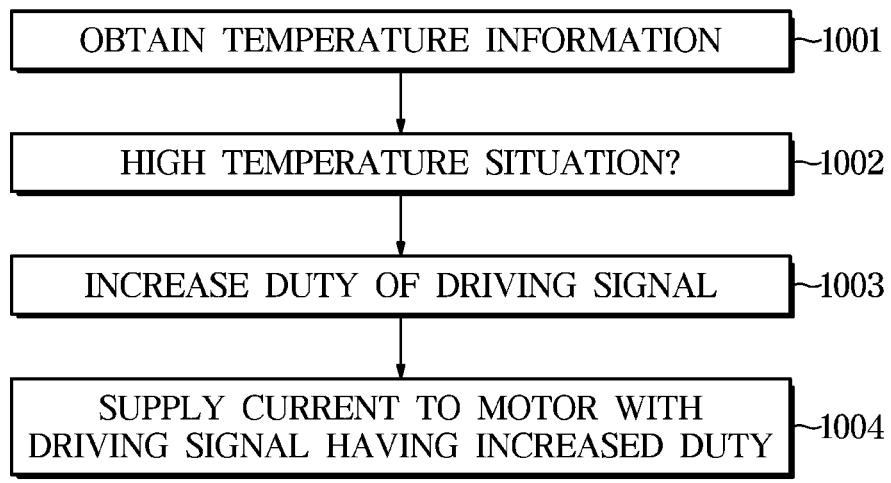
FIG. 7 is a flow chart according to an exemplary embodiment of the disclosure.

FIG. 7 is a flow chart according to an exemplary embodiment of the disclosure. Referring to FIG. 7, the converter 130 may be configured to obtain the temperature information from the temperature sensor 150 (1001). When the temperature of the switching element 120 increases, the converter 130 may be configured to increase the duty of the driving signal based on the sensing voltage and the clock signal received from the temperature sensor 150 (1002, 1003). Meanwhile, the converter 130 may be configured to supply the current to the motor 110 with the driving signal having the increased duty as described above (1004).

According to the exemplary embodiments of the disclosure, the vehicle and the method of controlling the vehicle may supply the constant current to the motor without changing the gate voltage even at the high temperatures.

The disclosed exemplary embodiments may be implemented in the form of a recording medium storing computer-executable instructions that are executable by a processor. The instructions may be stored in the form of a program code, and when executed by a processor, the instructions may generate a program module to perform operations of the disclosed exemplary embodiments. The recording medium may be implemented non-transitory as a non-transitory computer-readable recording medium.

The non-transitory computer-readable recording medium may include all types of recording media storing commands that may be interpreted by a computer. For example, the non-transitory computer-readable recording medium may be, for example, ROM, RAM, a magnetic tape, a magnetic disc, flash memory, an optical data storage device, and the like.

Embodiments of the disclosure have thus far been described with reference to the accompanying drawings. It should be apparent to those of ordinary skill in the art that the disclosure may be practiced in other forms than the exemplary embodiments as described above without changing the technical idea or essential features of the disclosure. The above exemplary embodiments are only by way of example, and should not be interpreted in a limited sense.

What is claimed is:

1. A vehicle, comprising:
    at least one switching element configured to supply a current to a motor;
    a temperature sensor configured to detect temperature information of at least one transistor;
    at least one processor configured to transmit a clock signal corresponding to driving of the motor;
    a driver configured to receive the clock signal, and transmit a driving signal to the transistor;
    a converter configured to determine a duty of the driving signal based on the temperature information received from the temperature sensor,
    wherein the temperature information includes a sensing voltage of the temperature sensor,
    wherein the processor is configured to correct the sensing voltage of the temperature sensor based on an increase in a temperature of the transistor, and
    wherein the converter is configured to increase the duty of the driving signal in response to the corrected sensing voltage.

2. The vehicle according to claim 1, wherein:
    the clock signal includes a triangular wave signal;
    the driving signal includes a pulse width modulation (PWM) signal; and
    the converter is configured to convert the triangular wave signal into the PWM signal.

3. The vehicle according to claim 1, wherein:
    the processor is configured to correct the sensing voltage of the temperature sensor based on a decrease in the temperature of the transistor; and
    the converter is configured to decrease the duty of the driving signal in response to the corrected sensing voltage.

4. The vehicle according to claim 1, wherein the converter is configured to determine the duty based on an intersection of the sensing voltage and the clock signal.

5. The vehicle according to claim 1, wherein:
    the at least switching element is provided with at least one transistor element; and
    a saturation current of the at least one transistor element is configured to be determined independently from the temperature information.

6. The vehicle according to claim 1, wherein the vehicle is provided as one of a hybrid electric vehicle (HEV), a battery electric vehicle (BEV), a plug-in hybrid electric vehicle (PHEV), and a fuel cell electric vehicle (FCEV).

7. A method of controlling a vehicle, comprising:
    obtaining, by a temperature sensor, temperature information of at least one transistor;
    transmitting, by at least one processor, a clock signal corresponding to driving of a motor to a driver;
    receiving, by the driver, the clock signal, and transmitting a driving signal to the transistor, and
    determining, by a converter, a duty of the driving signal based on the temperature information received from the temperature sensor,
    wherein the temperature information of the at least one transistor includes a sensing voltage of the temperature sensor, and
    wherein the determining of the duty of the driving signal includes:
        correcting the sensing voltage based on an increase in a temperature of the transistor; and
        increasing the duty of the driving signal in response to the corrected sensing voltage.

8. The method according to claim 7, wherein:
    the clock signal includes a triangular wave signal; and
    the driving signal includes a pulse width modulation (PWM) signal,
    the method includes converting, by the converter, the triangular wave signal into the PWM signal.

9. The method according to claim 7, wherein the determining of the duty of the driving signal includes:
    correcting the sensing voltage based on a decrease in the temperature of the transistor; and
    decreasing the duty of the driving signal in response to the corrected sensing voltage.

10. The method according to claim 7, wherein the determining of the duty of the driving signal includes:
    determining the duty based on an intersection of the sensing voltage and the clock signal.

11. The method according to claim 7, wherein:
    the at least switching element is provided with at least one transistor element; and
    a saturation current of the at least one transistor element is configured to be determined independently from the temperature information.

12. The method according to claim 7, wherein the vehicle is provided as one of a hybrid electric vehicle (HEV), a battery electric vehicle (BEV), a plug-in hybrid electric vehicle (PHEV), and a fuel cell electric vehicle (FCEV).

* * * * *